United States Patent [19]

Tu et al.

[11] 4,144,561
[45] Mar. 13, 1979

[54] CHIP TOPOGRAPHY FOR MOS INTEGRATED CIRCUITRY MICROPROCESSOR CHIP

[75] Inventors: George K. Tu, Rolling Hills; Lamar T. Baker, Manhattan Beach; Robert E. Markle, Palos Verdes; George E. Mager, Manhattan Beach, all of Calif.

[73] Assignee: Xerox Corporation, Stamford, Conn.

[21] Appl. No.: 813,902

[22] Filed: Jul. 8, 1977

[51] Int. Cl.$^2$ .......................... G06F 1/00; G06F 9/00
[52] U.S. Cl. ................................................... 364/200
[58] Field of Search ... 364/200 MS File, 900 MS File

[56] References Cited

U.S. PATENT DOCUMENTS 3,892,957  7/1975  Bryant .................................. 364/200

Primary Examiner—James D. Thomas
Attorney, Agent, or Firm—Ronald L. Taylor

[57] ABSTRACT

The chip topography of an MOS microprocessor chip. The chip architecture includes an internal data bus and an internal address bus. Input/output circuitry is located along the top edge of the chip and is coupled to the data bus. Output circuitry is located along the bottom edge and coupled to the address bus. A program storage area which includes a ROM is located in the lower left hand corner of the chip. The ROM contains instruction words for defining the operation of the microprocessor. A data storage area which includes a RAM is located in the upper left hand corner of the chip and is coupled to the data bus. An ALU area is located to the right of the data storage area and is coupled to the data bus for performing arithmetic and logic operations on data. A condition decode ROM located in the approximate center of the chip is coupled to the data bus and is used for decoding a condition field of an instruction word received from the ROM. A bus control area is located in the upper right hand corner of the chip. A programmed control area is located between the ALU area and the bus control area in the upper right hand portion of the chip and is coupled to the data bus for receiving instruction words from the program storage area and for generating commands which define the operation of the microprocessor in response to the instruction words. A clock/T-counter is located in the lower right hand corner and is used for synchronizing data signal flow in the microprocessor. A stack area is located in the lower right hand portion of the chip. Within this stack area are various registers located from top to bottom as follows; write X circuitry, an X register a stack array, stack read/write circuitry, a memory address register, and an incrementer. A stack control is located between the aforementioned stack circuitry and the right hand edge. In addition, a RAM decode is located between the RAM and the left hand edge, a ROM column decode is located between the ROM and the bottom edge, and a ROM row decode is located between the ROM and the stack area.

9 Claims, 30 Drawing Figures

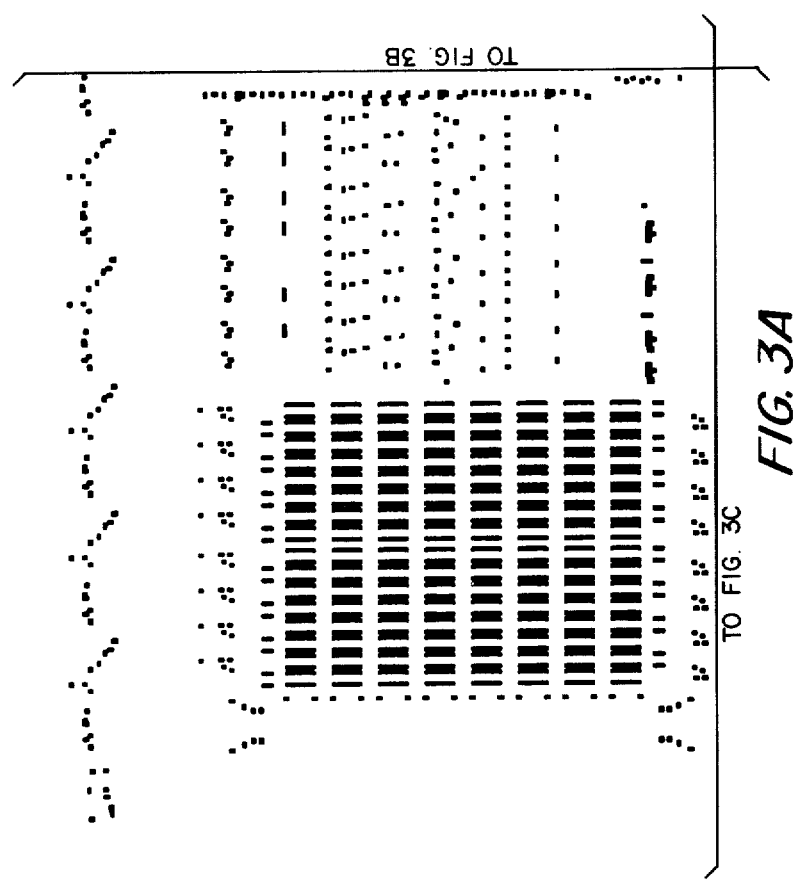

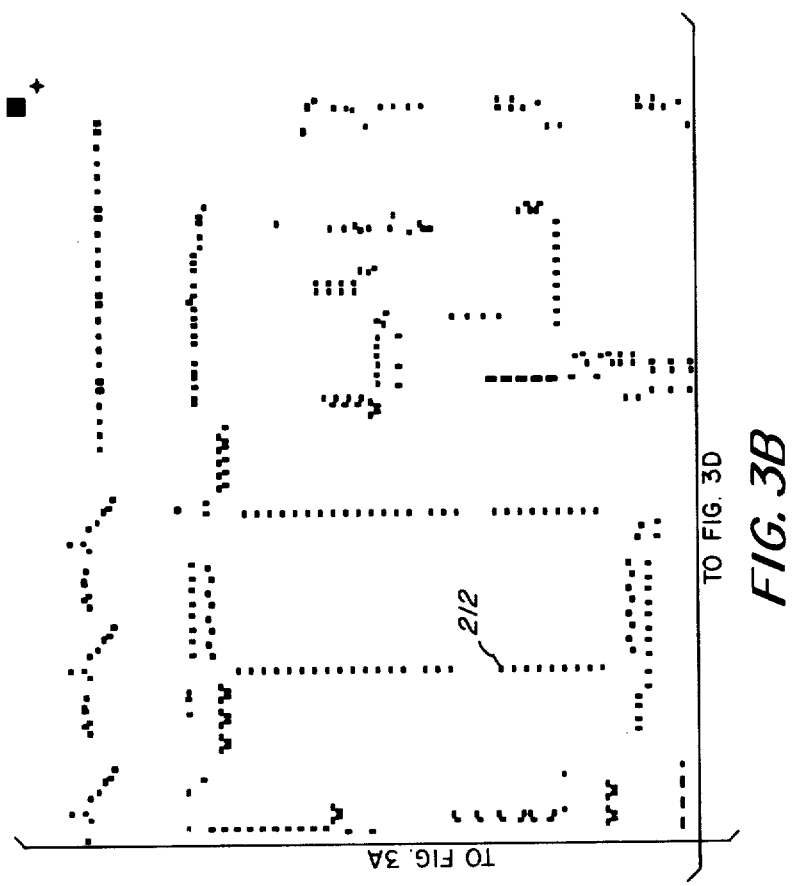

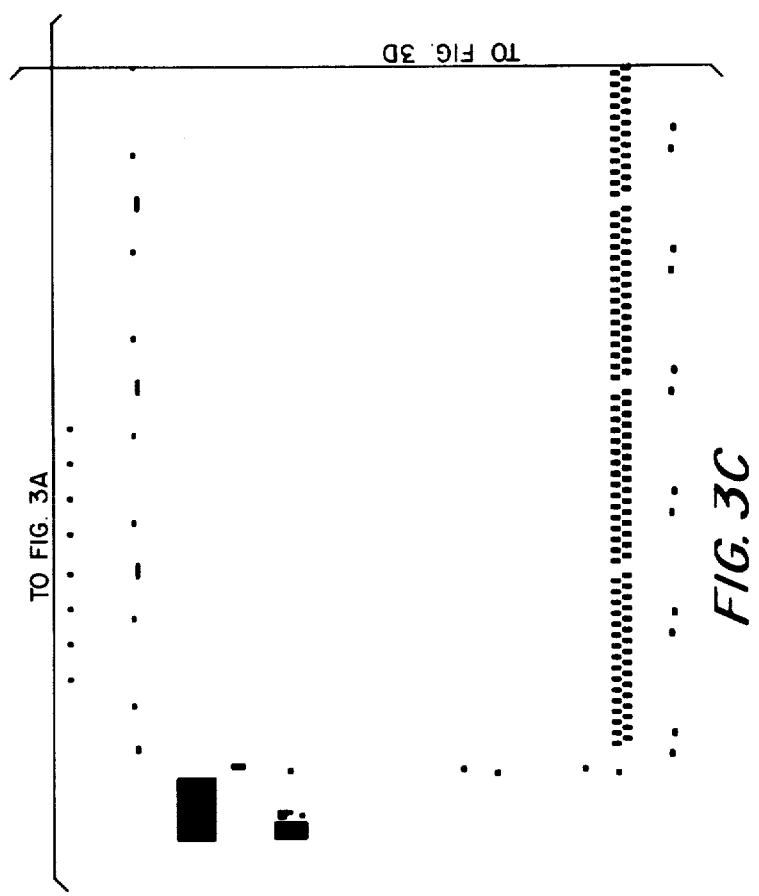

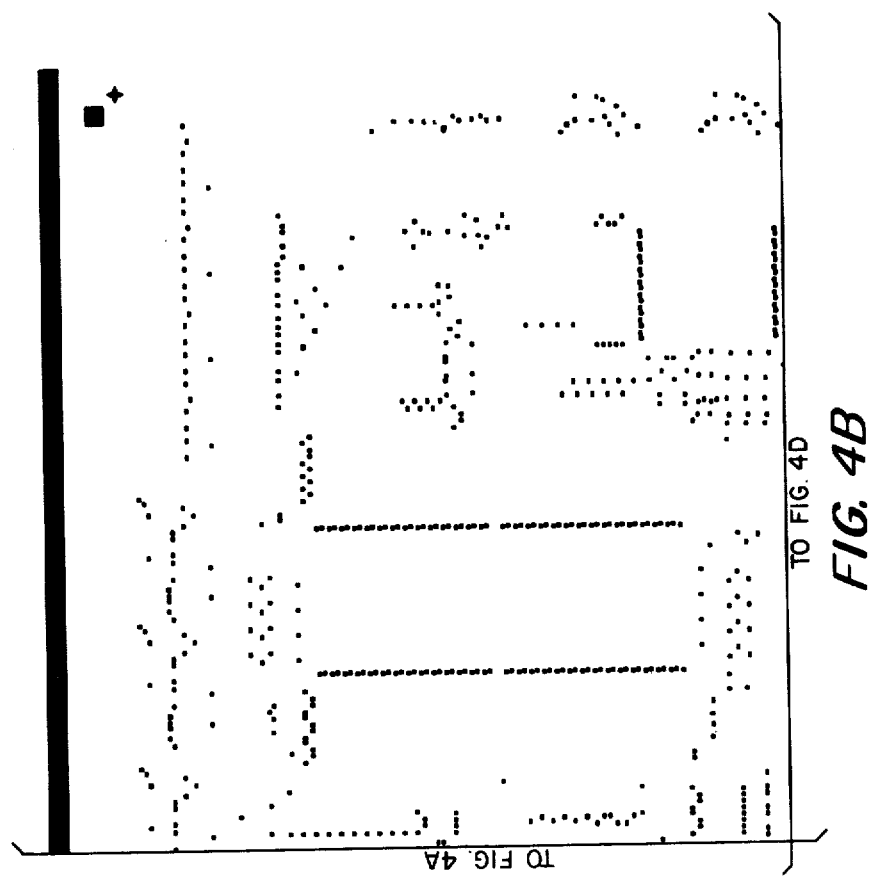

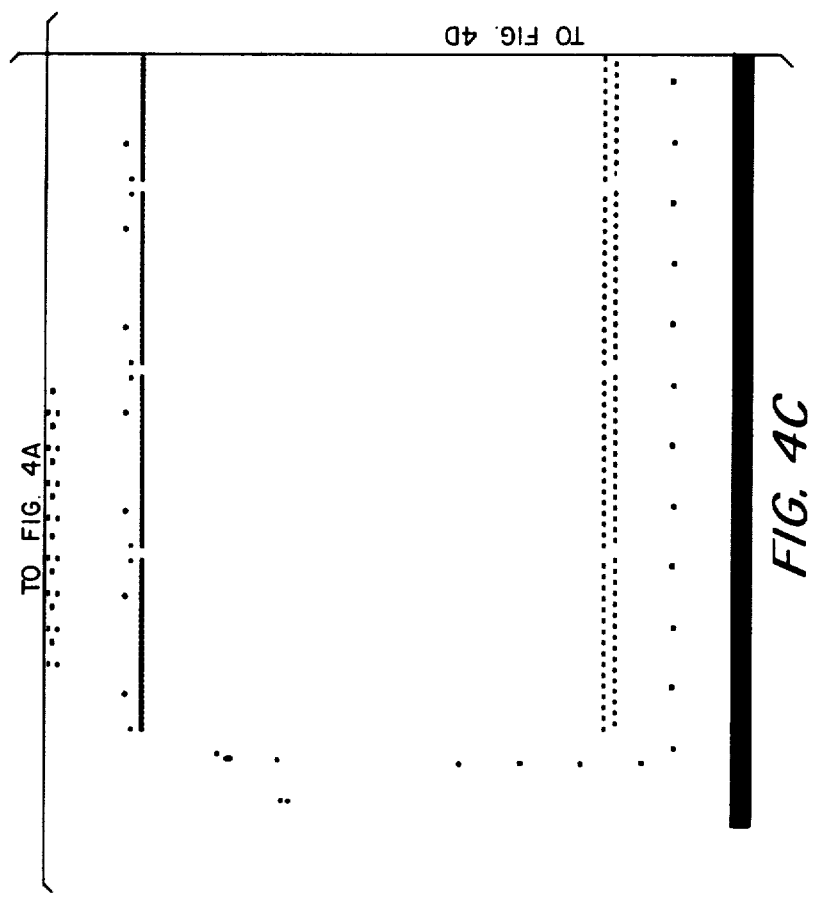

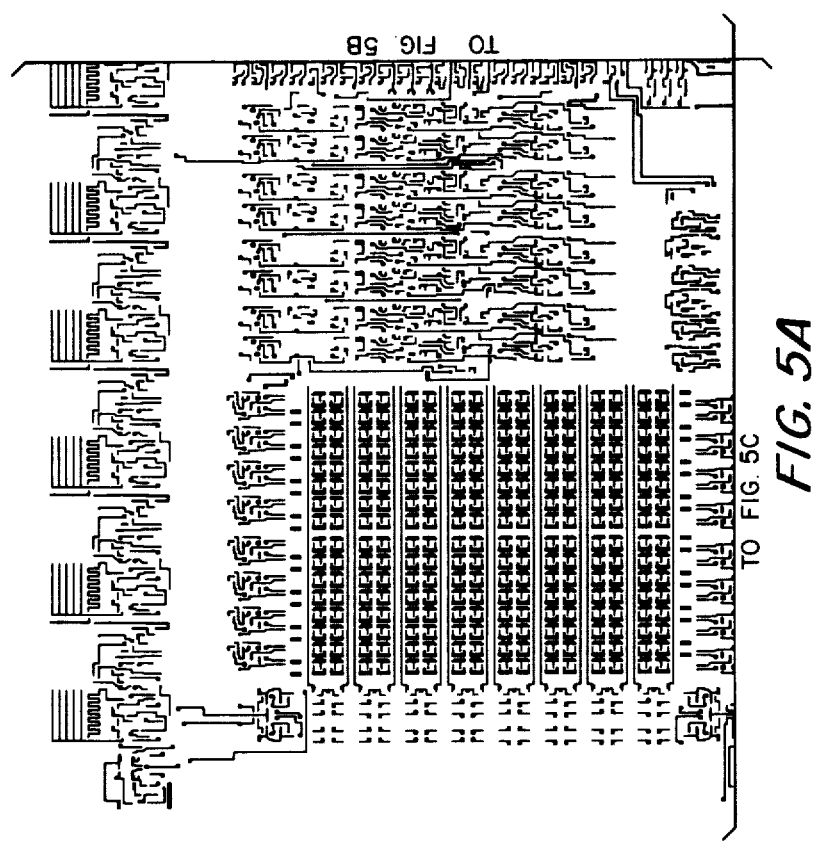

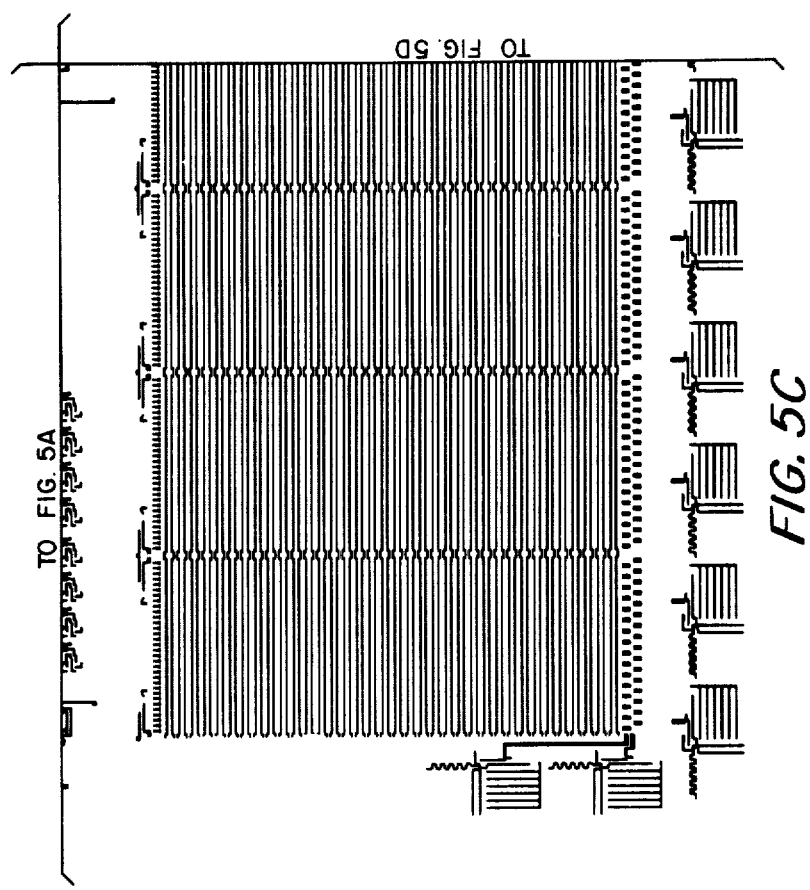

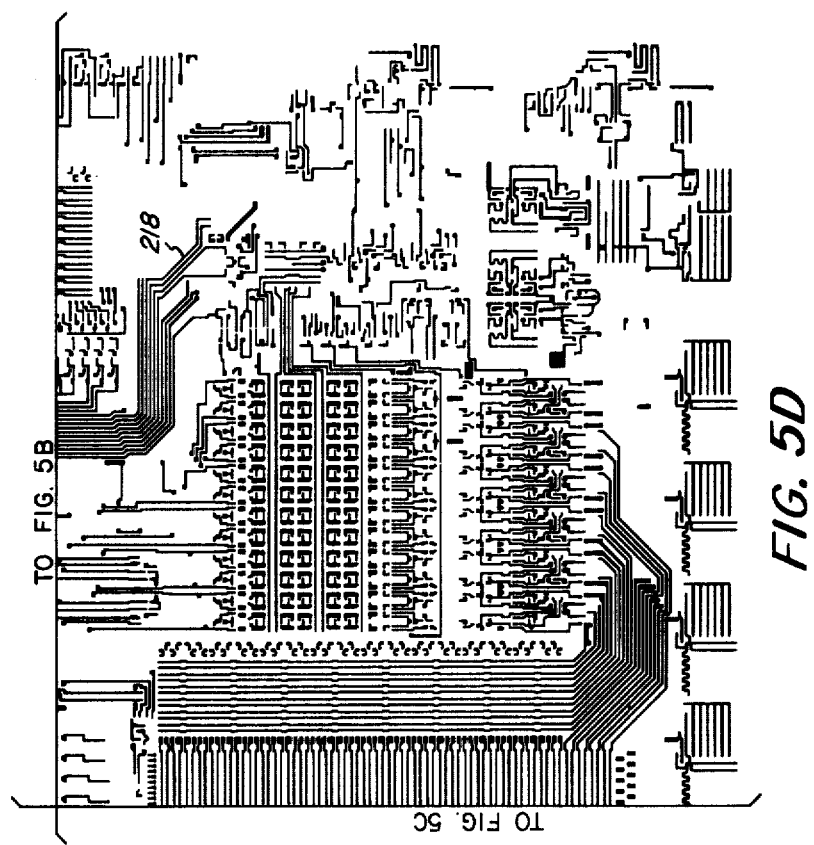

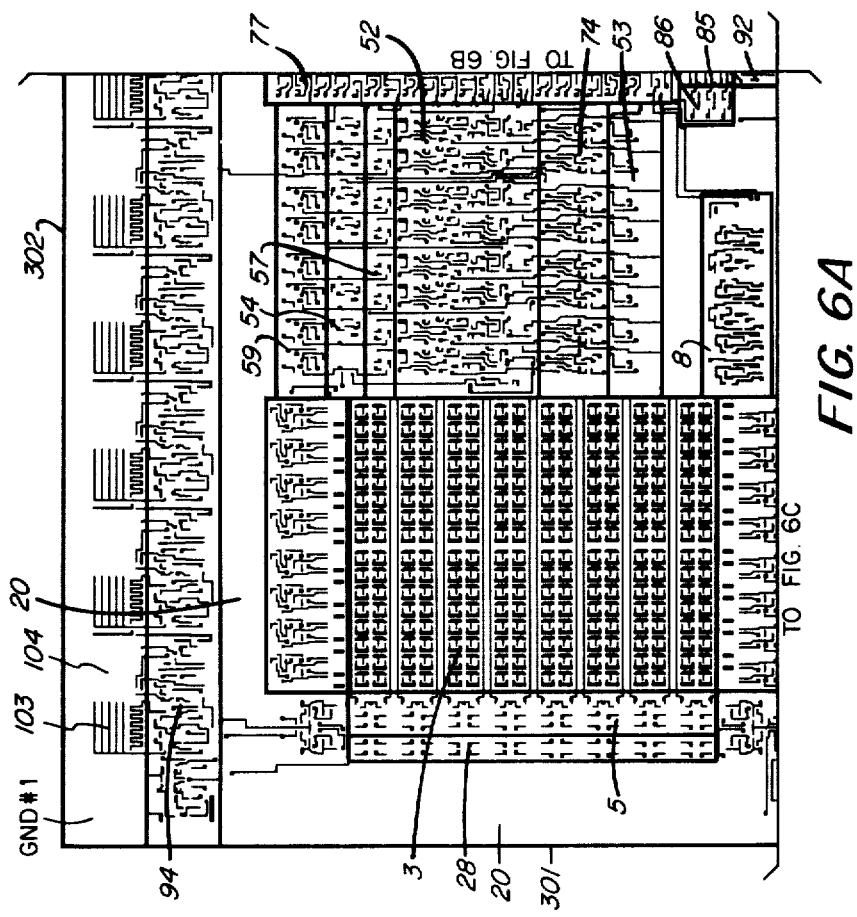

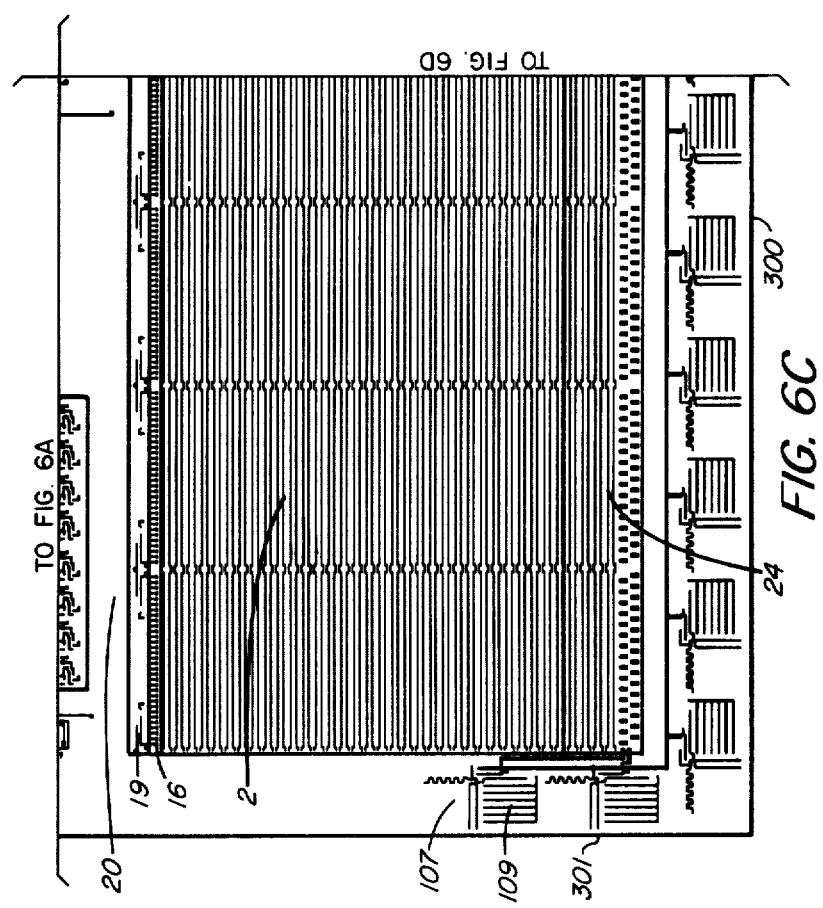

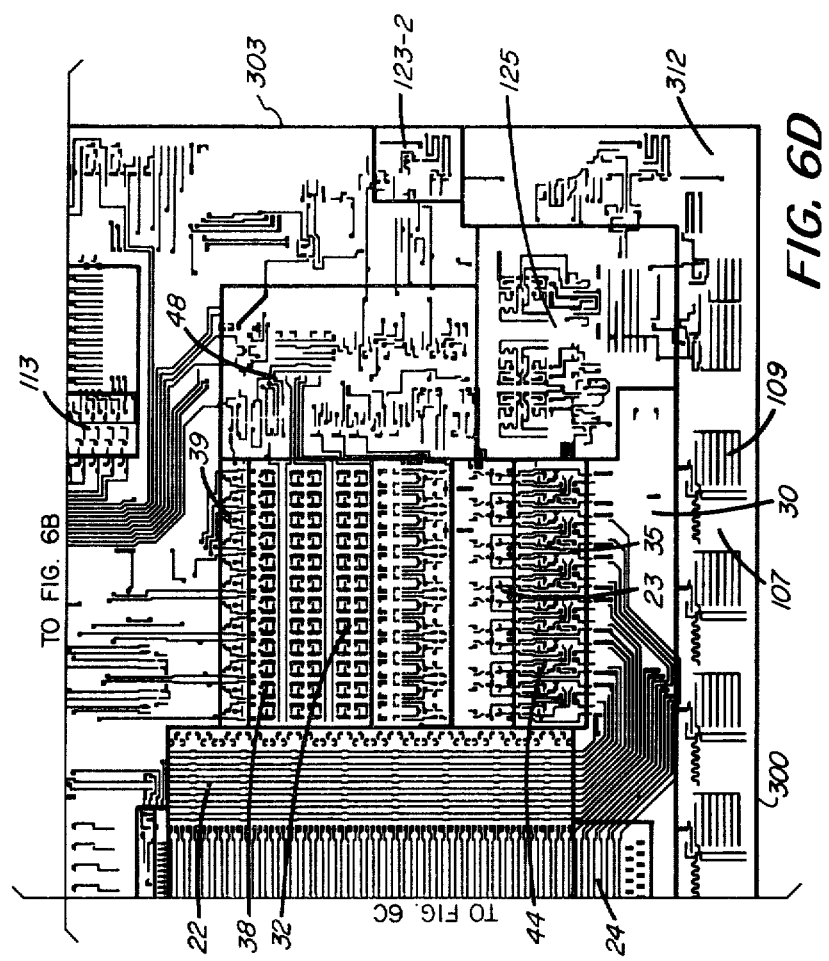

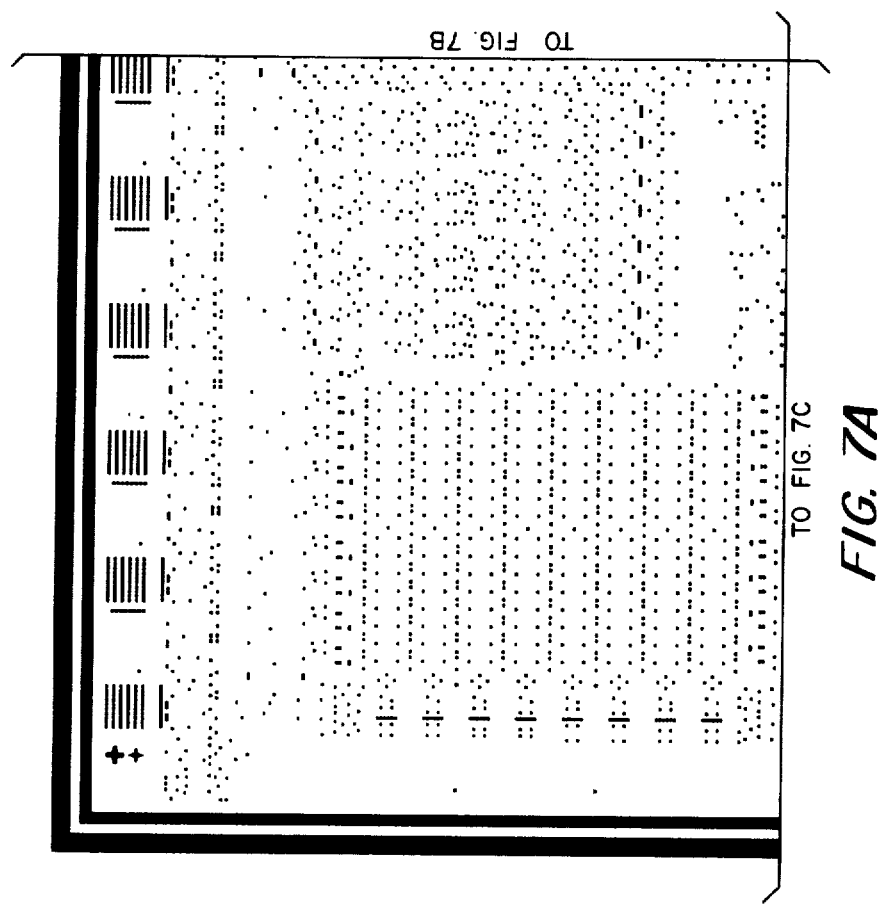

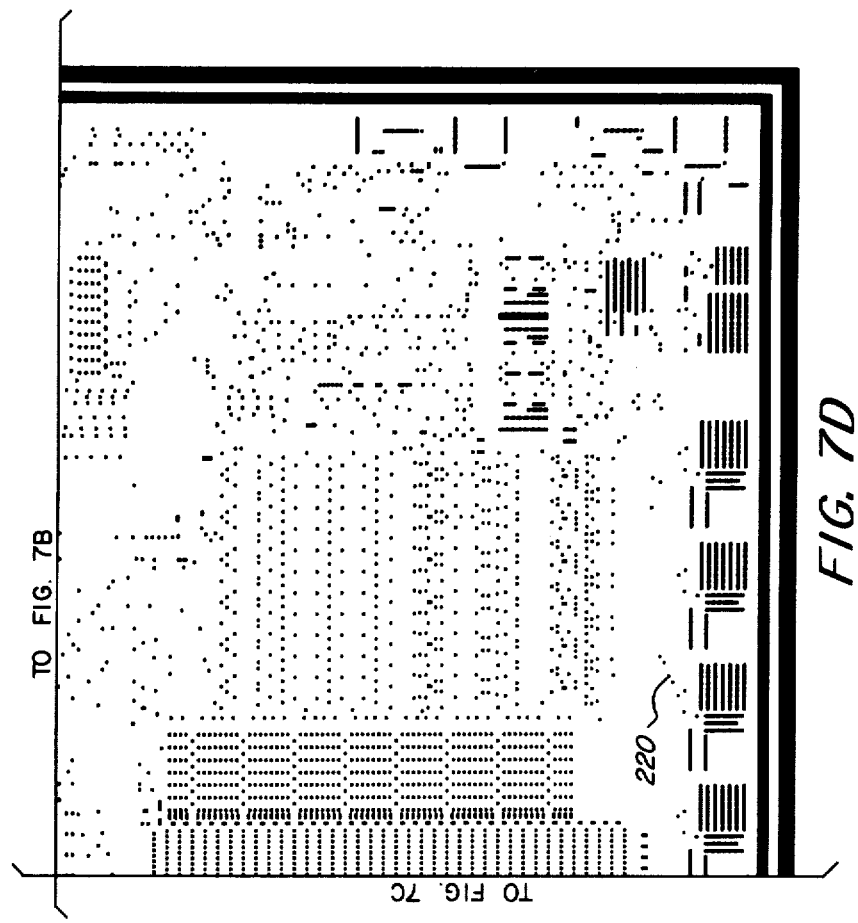

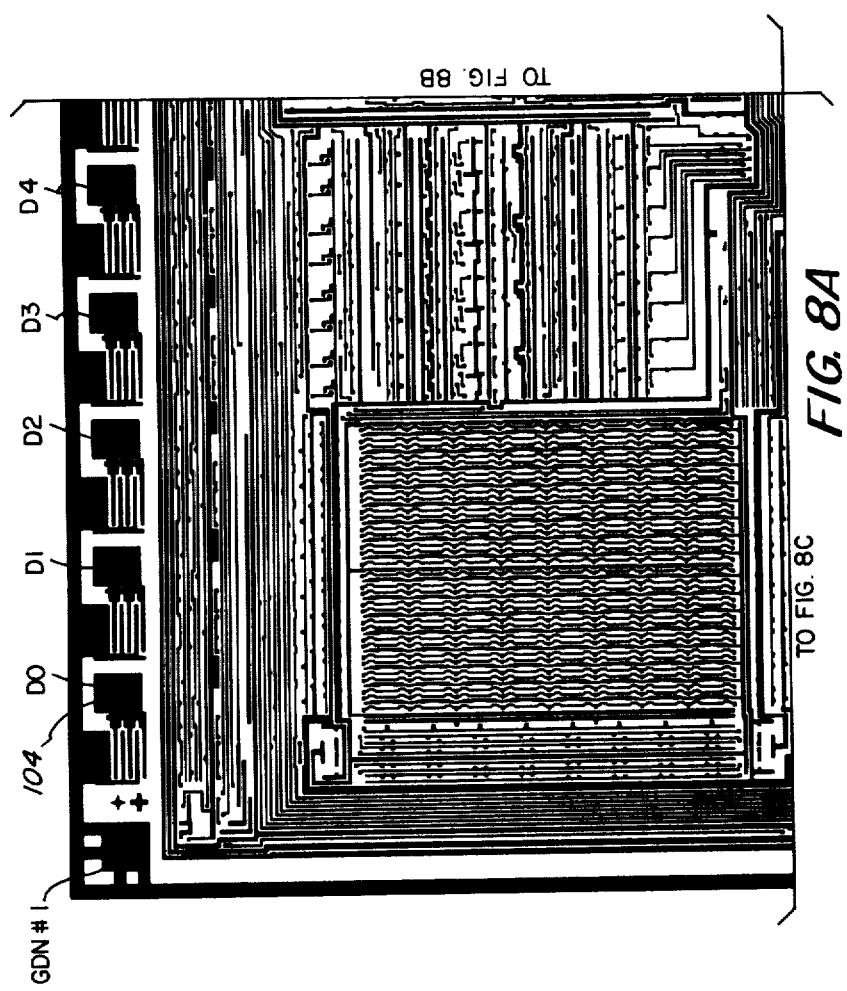

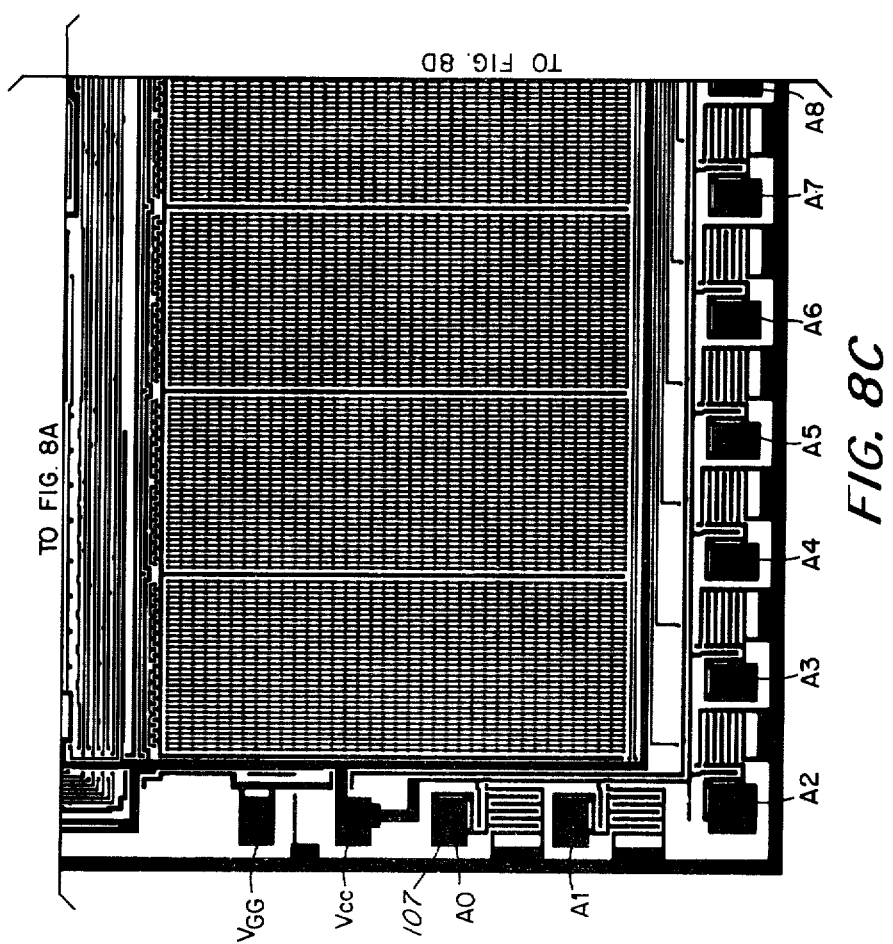

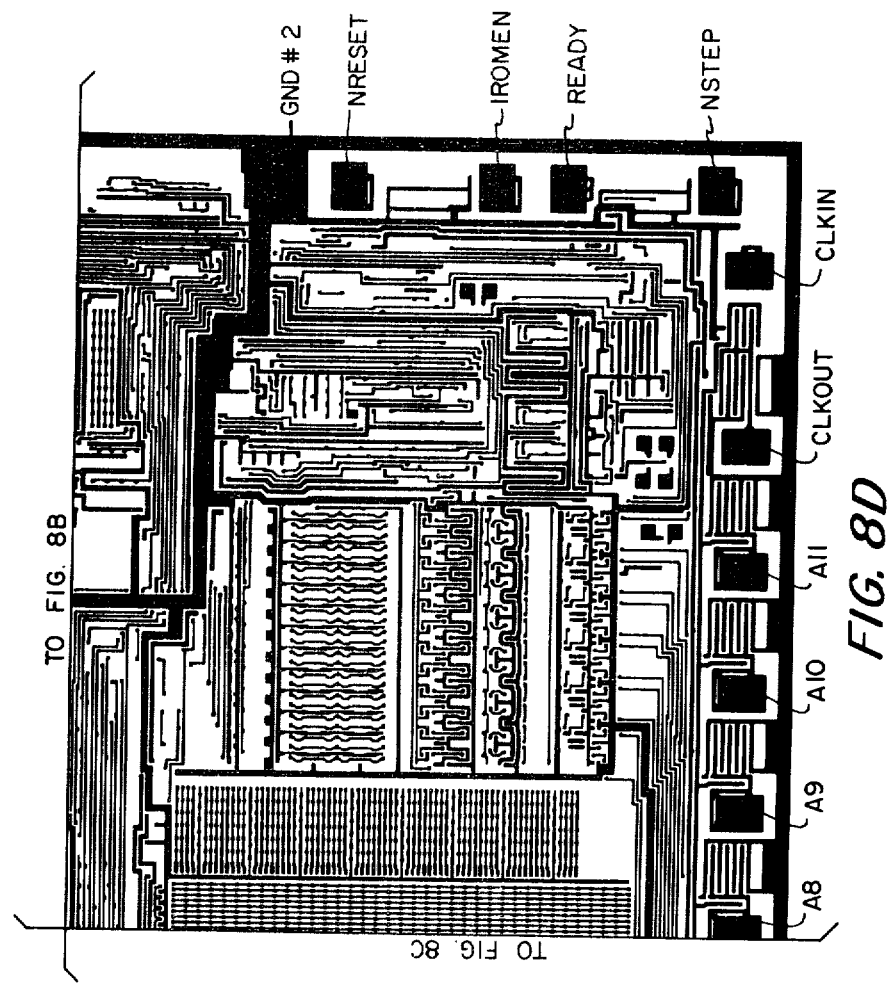

CHIP TOPOGRAPHY FOR MOS INTEGRATED CIRCUITRY MICROPROCESSOR CHIP

BACKGROUND OF THE INVENTION

An important factor in the economical manufacture of MOS LSI integrated circuits is reducing the amount of silicon required to produce the semiconductor chips on which the integrated circuits are fabricated. MOSFET devices and the interconnection pattern of conductors therebetween must be optimized to provide the highest functional component density in order to reduce the chip area per circuit function. Minimum geometry spacings between metallization lines, diffused regions and polycrystalline silicon conductors must be maintained, yet the length of such lines and the associated capacitances must be minimized as complex interconnection patterns are implemented. Parasitic electrical leakage paths in the circuit must be minimized or compensated for in the chip topology. A very high degree of creativity is required of the chip architect in order to choose a particular layout and interconnection pattern for an LSI circuit from the large number of possibilities that exist for arranging such a layout. Frequently, the commercial success of an MOS LSI product may hinge on the ability of the chip architect to achieve an optimumized chip topography.

SUMMARY OF THE INVENTION

Briefly described, the invention is an MOS LSI microprocessor chip having optimumized chip topography. The chip topography includes an internal data bus and an internal address bus. Input/output circuitry is located along the top edge of the chip and is coupled to the data bus. Output circuitry is located along the bottom edge and coupled to the address bus. A program storage area which includes a ROM is located in the lower left hand corner of the chip. The ROM contains instruction words for defining the operation of the microprocessor. A data storage area which includes a RAM is located in the upper left hand corner of the chip and is coupled to the data bus. An ALU area is located to the right of the data storage area and is coupled to the data bus for performing arithemtic and logic operations on data. A condition decode ROM located in the approximate center of the chip is coupled to the data bus and is used for decoding a condition field of an instruction word received from the ROM. A bus control area is located in the upper right hand corner of the chip. A PLA control area is located between the ALU area and the bus control area in the upper right hand portion of the chip and is coupled to the data bus for receiving instruction words from the program storage area and for generating commands which define the operation of the microrocessor in response to the instruction words. A clock/T-counter is located in the lower right hand corner and is used for synchronizing data signal flow in the microprocessor. A stack area is located in the lower right hand portion of the chip. Within this stack area are various registers located from top to bottom as follows; transfer register write circuitry, a transfer register, stack circuitry, stack read/write circuitry, a memory address register, and an incrementer. A stack control is located between the aforementioned stack circuitry and the right hand edge of the chip. In addition, a RAM decode is located between the RAM and the left hand edge, a ROM column decode is located between the ROM and the bottom edge, and a ROM row decode is located between the ROM and the stack area. The bonding pad sequence is selected to allow optimum arranging of packages containing the microprocessor chip on a printed circuit board and to facilitate optimizing the microprocessor chip topography.

It is an object of this invention to provide improved semiconductor chip topography for an integrated circuit MOS microprocessor chip.

It is another object of this Invention to provide minimum length of interconnection conductors on the surface of the microprocessor chip.

It is a further object of the invention to provide a chip topography for a microprocessor chip in which the various logic circuitry and register sections are situated so that information flows substantially directly from a given circuit section to an adjacent circuit section during execution of an instruction.

It is still another object of the invention to provide a chip topography for a microprocessor chip in which extensive use is made of array logic to achieve repetitive and simple structures.

It is yet a further object of the invention to provide a chip topography in which the microprocessor circuitry is made modular.

Other objects and advantages of this invention will further become apparent hereinafter and in the drawings, in which:

BRIEF DESCRIPTION OF THE DRAWINGS

FIGS. 3A-D are scale drawings of a depletion mode transistor gate inplant mark used in manufacture of a microprocessor chip according to the invention.

FIGS. 4A-D are scale drawings of a polycrystalline silicon-to-source-drain diffused region preohmic mask used in manufacture of a microprocessor chip according to the invention.

FIGS. 5A-D are scale drawings of a photomask used to pattern a polycrystalline silicon layer on a microprocessor chip according to the invention.

FIGS. 6A-D are scale drawings identical to FIG. 5 except that circuit sections similar to those in FIG. 1 are identified and blocked out with heavy lines to show their location on the microprocessor chip.

FIGS. 7A-D are scale drawings of a photomask used to pattern preohmic openings between diffused regions and interconnection metallization during manufacture of a microprocessor chip according to the invention.

FIGS. 8A-D are scale drawings of a phomomask used to pattern a metal interconnection layer of a microprocessor chip according to the invention.

DESCRIPTION OF THE INVENTION

The subject matter described herein is related to the subject matter of copending patent applications; MICROCOMPUTER OR DIGITAL PROCESSOR CHIP, Serial No. 814,065 filed on even date herewith, MOS Buffer Circuit, Ser. No. 779,122, filed Mar. 18, 1977, and Bistable Circuit, Ser. No. 777,212, filed Mar. 14, 1977, all of which are assigned to the assignee of the present invention.

Figure 1:
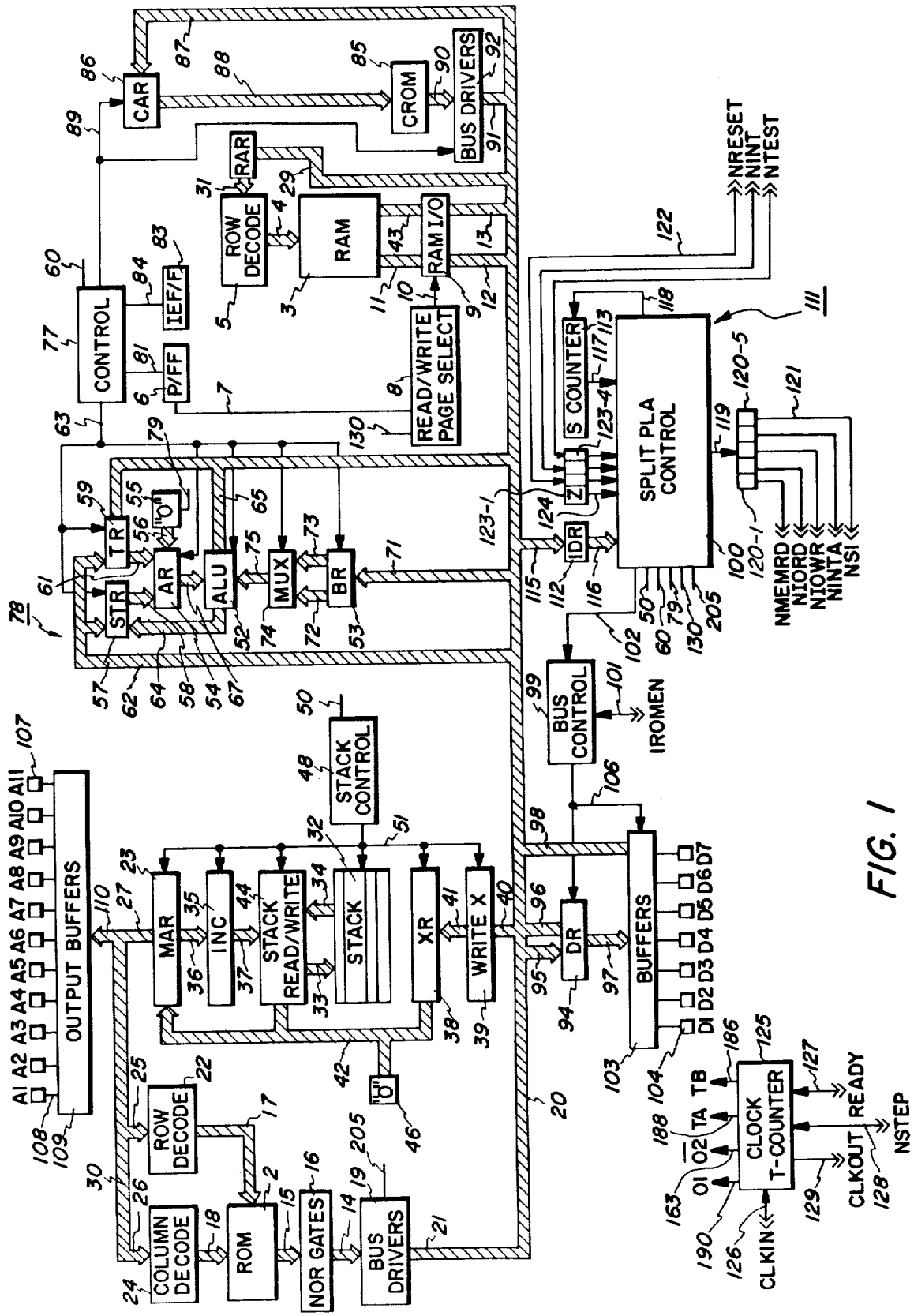
FIG. 1 is a functional block diagram of an integrated circuit microprocessor chip, the integrated circuit topography of which is the subject of the invention.
Figure 2A:
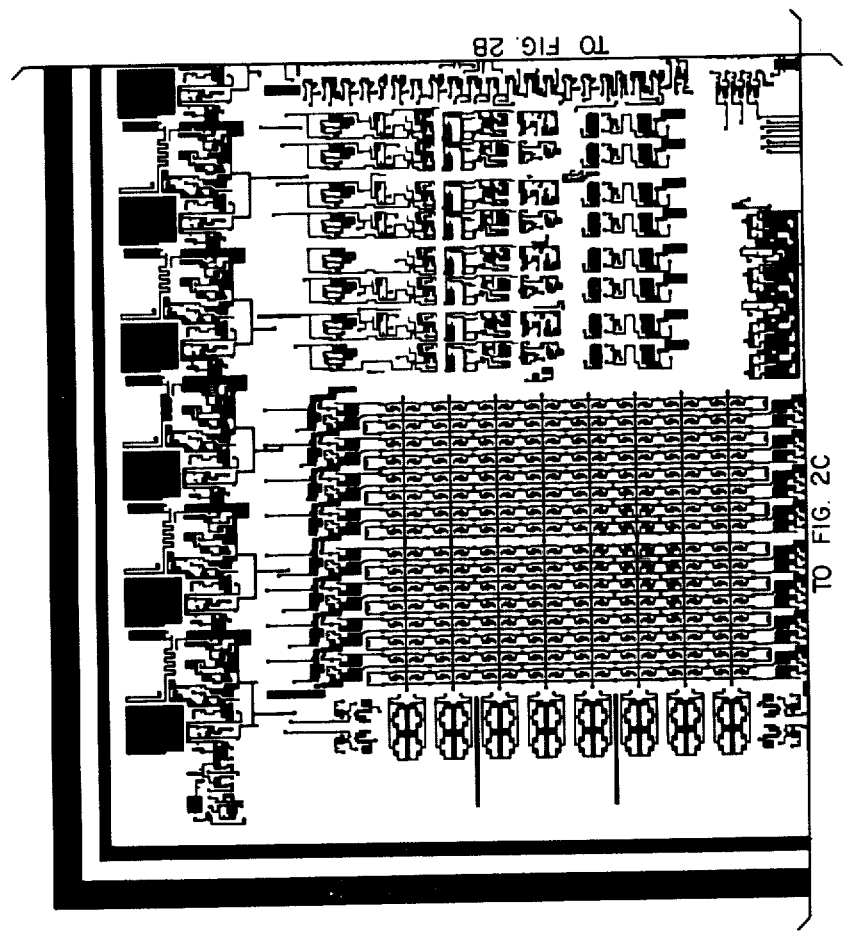
FIG. 2A-D are scale drawings of a photomask utilized to pattern source-drain diffusion regions in the manufacture of a microprocessor chip according to the invention.
Figure 2B:
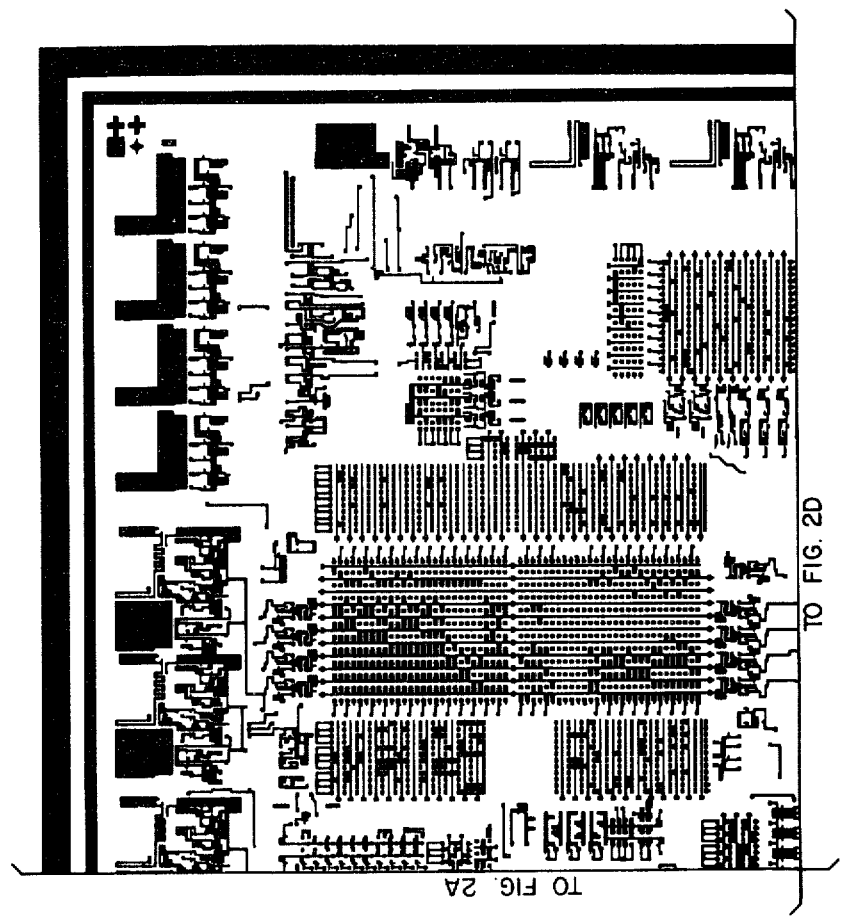
Figure 2C:
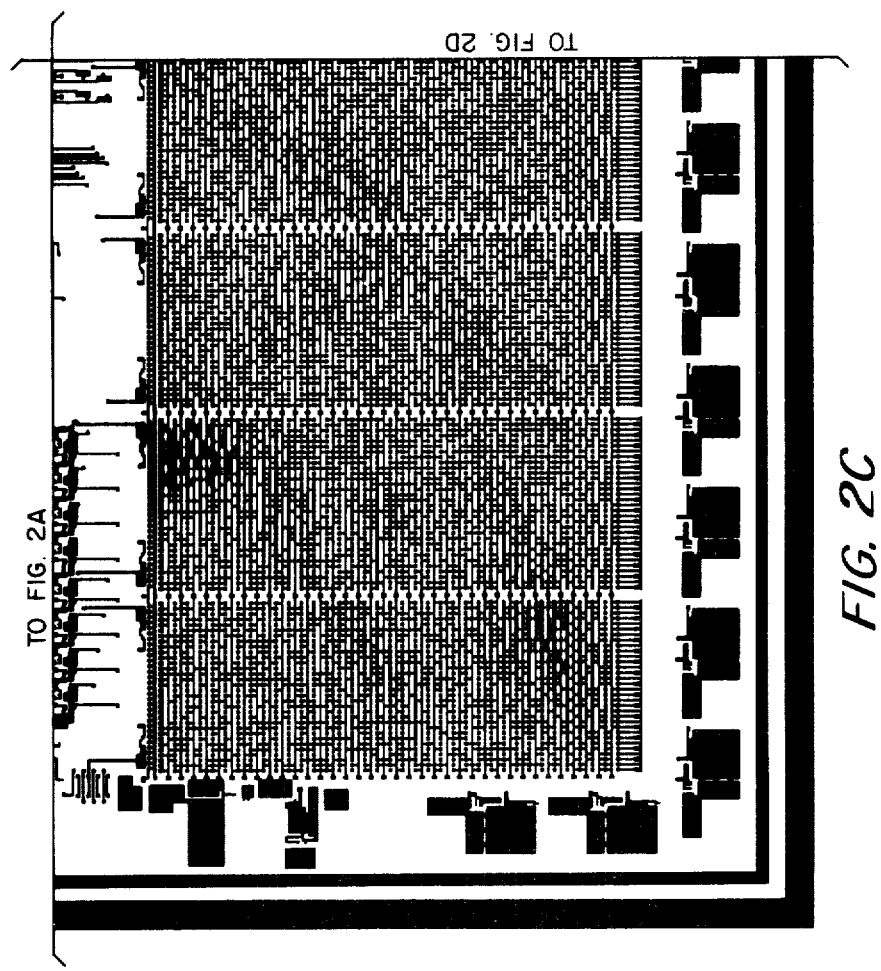
Figure 2D:
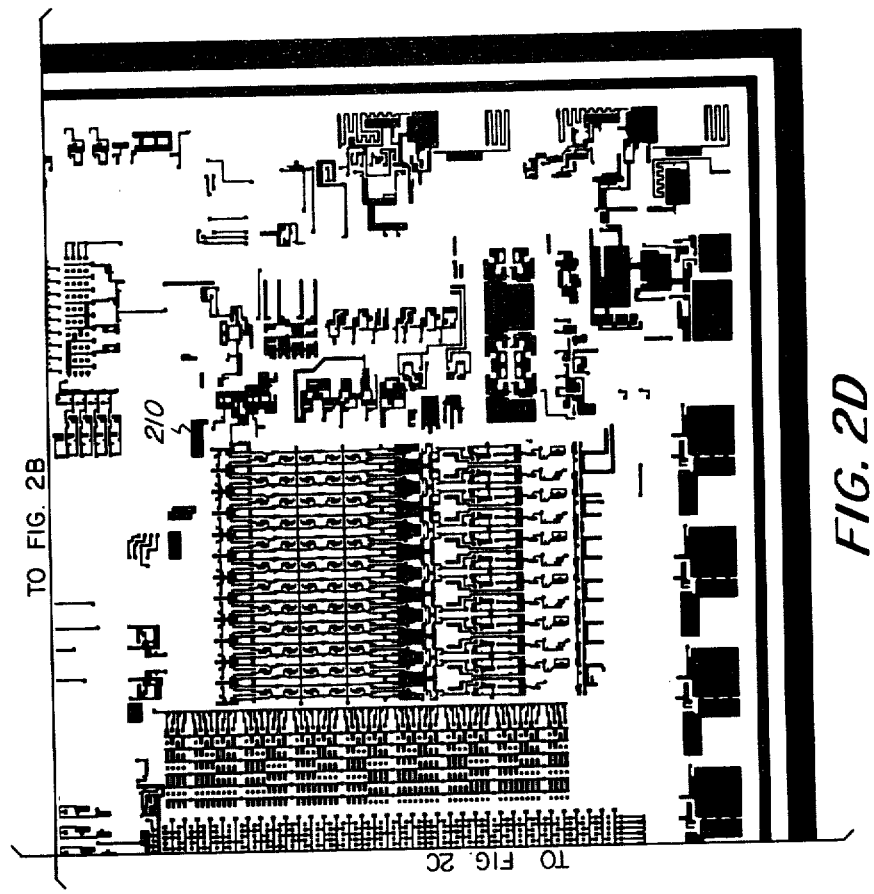

FIG. 1 is a functional block diagram of an integrated circuit microprocessor chip, the topography of which is the subject of the present invention. For a more complete description of the circuitry, structure, and operation of the microprocessor of FIG. 1, refer to the above-mentioned copending patent applications.

In FIG. 1, it is seen that the microprocessor system is centered around a ROM (read-only memory) 2 and a ROM (read-only memory) 2 and a RAM (random-access memory) 3. The ROM 2 contains 1024 instruction words of 8 bits per word, and is used to store all or part of the application program which operates the system. The RAM 3 contains 256 memory cells software organized as two, 16-digit groups with 8 bits per digit. The RAM functions as the working registers of the system, although it is not organized in the hardware sense as separate registers as would be true if shift registers or the like were used for this purpose. The RAM is addressed by a word address on lines 4, i.e., one out of 16 word lines in the RAM is selected, by means of a RAM row decode circuit 5. One of 2 "pages", P0 or P1, of the RAM is selected by a page select flip-flop (PF/F) 6 which produces a page select signal on leads 7. This signal is applied to combined read/write page select circuitry 8. RAM input/output circuitry (RAM I/O) 9 responds to a signal on leads 10 to carry out the page select operation. For a given word address on lines 4 and page address on lines 10, eight specific bits are accessed and read out on RAM I/O lines 11 (for page Po) and 43 (for page P1), via input/output circuitry 9, to RAM read lines 12 and 13 respectively. Alternatively, data is written into the RAM 3 from the data bus 20 on leads 12 and 13 via the input/output circuitry 9 and the lines 11 and 43 respectively.

The ROM 2 produces an eight-bit instruction word on NOR output lines 14 as the instruction word passes out of the ROM along leads 15 and through NOR gate array 16 (the bits of the instruction word being labeled D0-D7, D7 being the most significant bit) during each instruction cycle. The instruction is selected from 8192 bit locations in the ROM, organized into 1024 words containing 8 bits each. The ROM is divided into eight 16-bit columns with each column being dedicated to producing one of the eight bits (Do-D7) of the instruction word. To address an instruction in the ROM requires a one-of-64 ROM row address on the lines 17 and a one-of-16 ROM column address on lines 18 to each of the eight columns. On lines 15 of the output of each column is directed into one of eight dedicated 16-to-1 NOR gates 16. The outputs of the NOR gates produce the instruction word on leads 14. The instruction word is then placed on the data bus 20 by bus drivers 19 along leads 21. The ROM row address on lines 17 is generated in a row decoder 22. The ROM row address is a 12 bit address produced in a memory address register (MAR) 23. The ROM column address on lines 18 is generated in a column decoder 24. The ROM column address is an 8-bit address produced in the MAR 23. The ROM row decoder 22 and the ROM column decoder 24 receive a 12-bit and an 8-bit encoded address respectively on lines 25 and 26 from MAR lines 27 via the address bus 30.

A RAM address register (RAR) 28, containing 4 sample and latch devices, receives from the data bus 20 a 4-bit encoded address comprising the least 4 significant bits an instruction word on line 29. The 4-bit encoded address is then put into the RAM row decode 5 via lines 31.

A stack 32, having four 12-bit registers organized as a push-down stack, is associated with the MAR 23 to serve as temporary storage for the return word address during subroutine and interrupt operations. A 12-bit address is stored in the stack 32, via lines 33 when a call instruction is initiated so that this same address may be loaded back into the MAR 23 via lines 34 when execution of the subroutine or the interrupt which begins at the call location has been completed.

A 12-bit incrementer (INC) 35 takes a present address on lines 36 from MAR 23 and increments it to generate a next address on lines 37. A 12-bit transfer register (X REG) 38 is used to transfer information from the data bus 20 to the address bus 30 via the MAR 23. Write circuitry (WRITE X) 39 is provided to transfer data from the data bus 20 on lines 40 the X REG 38 on lines 41. The information in the X REG 38 is transferred to the MAR 23 via lines 42 and 43. Stack read/write circuitry 44 is provided to transfer data between the INC 35, on lines 37 the STACK 44 on lines 33 and 34, and the MAR 23 on lines 42. A reset signal 46 is provided to the MAR 23 via lines 42 in order to start memory address generation from the beginning. The MAR, INC, STACK read/write, STACK, X REG and WRITE X are all controlled via lines 51 by stack control circuitry 48 which receives inputs from the Split PLA Control 100 on lines 50. The stack Control circuitry 48 determines whether branch-and-call-on-status, interrupt, or subroutine operations are performed; causes loading of an instruction word into the MAR; controls transfer of bits to the subroutine or buffer registers and back; controls updating of the MAR, etc.

Numerical data and other information os operated upon in the system by an arithmetic and logic unit (ALU) 52. The ALU is an eight-bit parallel logic network used in the execution of the system instructions. Certain other registers are provided as part of the ALU subsystem 78 and will be described in greater detail hereinafter. An A-Register (A-Reg) 54 stores one of the operands for ALU operations. This register may be cleared at any time through the use of a "0" reset 55 whose output enters the A-Reg 54 via lines 56. The A-Reg receives its input from eight a status register (ST-Reg) 57 via lines 58 or a temporary register (Temp-Reg) 59 via lines 61. The ST-Reg 57 stores the status indications resulting from an arithmetic or logic operation. The ST-Reg receives its information either from the data bus 20 via lines 62 or from the ALU 52 via lines 64. The output of the ST-Reg may be placed on the data bus via lines 58, the A-Reg, lines 67, the ALU, lines 65, and lines 66. The Temp-Reg 59 holds data to aid in accomplishing ALU operations. The Temp-Reg receives data from the data bus via lines 62 and outputs data to the data bus via lines 66. The B-Register 53 is the second operand for the ALU and receives information from the data bus via lines 71. The B-Reg outputs its contents via lines 72 and the complement of its contents via lines 73 into a multiplexer 74 which selects the state of the contents to be placed into the ALU via lines 75. All the elements of the ALU subsystem 78 receive control signals from a control 77 via lines 76. The control 77 in turn receives control signals from the split PLA control 100 via lines 60. It should be noted however that the "0" reset 55 receives its control signal directly from the PLA control via line 79. The control 77 also provides control signals to the Page F/F via lines 81 and an interrupt enable flip-flop (IE F/F) 83 via line 84.

A condition decode ROM (CROM) 85 decodes a condition field of an instruction. This is accomplished in the following manner. A condition code comprising the three least significant bits of an instruction word is received by a CROM address register (CAR) 86 from the data bus 20 via lines 87. The introduction of the condition code into the CROM via lines 88 is controlled by control 77 via lines 89. The CROM generates a condition mask, as an 8-bit word, which is put onto the data bus via lines 90 and 91, and bus drivers 92, which are controlled by control 77 via lines 93.

A data register (D-Reg) 94 is used to capture data during a memory-read via lines 95 or input operation via lines 96 or to store data to be driven off the chip via lines 97 during an output operation. The D-Reg is under the control of a bus control 99 via lines 101. The bus control is in turn controlled by PLA control 100 via lines 102.

Transfer of data onto and off the chip takes place at the data pins 104 which are connected to the I/O buffers 103 via lines 105. During a transfer operation the I/O buffers are controlled by the bus control via lines 106.

The MAR 23, as stated before, can address 4096 memory locations. The internal ROM 2 occupies the address space 0000 to 1023 words. External memory devices occupying the address space 1024 to 4095 words may be employed if required. The external memory receives address words on address pins 107 via lines 108, output buffers 109, and lines 110 from the address bus 30.

The system control 111 consists basically of an instruction decode register (ID-Reg) 112, an S-counter 113, and a PLA control 114. The ID-Reg 112 receives Op-Code information during each instruction fetch via lines 115 from the data bus. The S-counter 113 contains the basic machine-state information. The PLA control 114 receives data from the ID-Reg via lines 117. The PLA control then performs combinational logic that generates internal control signals, external interface signals, and next state feedback information to the S-counter. The internal control signals appear on control lines 50, 60, 79, 102, 130 and 205. The feedback to the S-counter appears on lines 118.

Output external interface signals eminate from the PLA control on lines 119, are placed into 5 flip-flop output circuits 120. Each one of the flip-flop circuits produces an external interface signal at its output 121. The mnemonics for these five output signals are NMEMRD, NIORD, NIOWR, NINTA, and NS1. The NMEMRD (Not-Memory-Read) signal is used to gate external memory onto the data bus during a memory-read operation. The NIORD (Not-Input/Output-Read) signal is used to gate external input devices onto the data bus during an input operation. The NIOWR (Not-Input/Output-Write) signal is used as a write-strobe to external output devices; that is, it indicates during an output operation, that data is available from the system. The NINTA (Not-Interrupt Acknowledge) signal indicates by NINTA equals logic 0 that an interrupt has been accepted. The NS1 (not-S1-Cycle) signal indicates to a support system that an opcode fetch cycle is commencing. This may be used, for example, in conjunction with IROMEN to force the execution of a support-system supplied instruction.

Input interface signals are received on lines 122, placed into three input latch circuits 123, for receipt by the PLA control via lines 124. The mnemonics for the input interface signals are NRESET, NINT, and NTEST. When the NRESET (Not-Reset) signal is at logic 0, it forces the data system into a reset state. During reset the P F/F 6 is reset to "0" and the IE F/F 83 is reset disabling interrupts. During reset all control lines are in the inactive state. When NRESET becomes "1", the data system accesses location X'0000'. The NINT (Not-Inpurrupt) signal is used to interrupt the normal operation of the data system. An interrupt is accepted only if the following are true: NINT = "0", IE F/F 83 is set, and the data system has completed executing the current instruction. When interrupted, the data system saves the current memory address, disables interrupts (resets the IE F/F), generates an interrupt-acknowledge stroke (NINTA), and forces a jump to memory location X 'OFF'. The NTEST (Not-Test) signal is used to dump the contents of the internal ROM 2.

A clock/T-counter 125 provides the basic clock and timing voltage waveforms used in the data system. The clock/T-counter is operated by a signal CLKIN received from an external clock (not shown) on line 126. An external READY signal is provided to the clock/T-counter via lead 127. The READY signal is used to synchronize the data system with a slower external memory or I/O devices (not shown). An NSTEP (not-step) signal, provided to the clock/T-counter via line 128, is used by an external support system (not shown) to step the data system through internal machine states. The condition NSTEP=0 prevents the data system from proceeding to its next machine state. A CLKOUT (clock output) signal is provided via line 129 as a means to synchronize external circuitry with the operation of the data system. In the preferred embodiment the period of CLKOUT is twice that of CLKIN.

Figure 9:
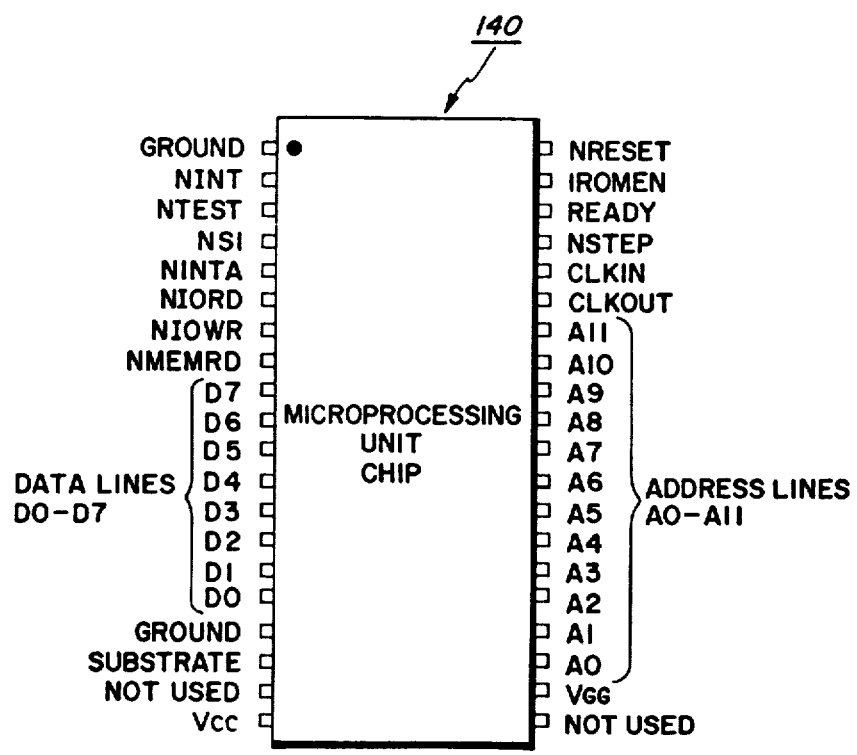
FIG. 9 is a drawing designating external lead assignments of a 40 pin dual-in-line package suitable for housing a microprocessor chip as illustrated in the earlier drawings.

The external signals applied to or generated by the microprocessor unit are illustrated in FIG. 9, which indicates the external lead connections of the forty-pin package housing the microprocessor chip. The dual-inline-package (DIP) is designated by reference numeral 140.

FIG. 2 is a drawing of a source-drain diffusion mask utilized in manufacturing the presently preferred embodiment of the invention for an N-channel silicon gate MOS manufacturing process. The darkened areas on a chip such as area 210 designate the source regions, the drain regions and the channel regions of subsequently formed MOSFETs.

Figure 3D:
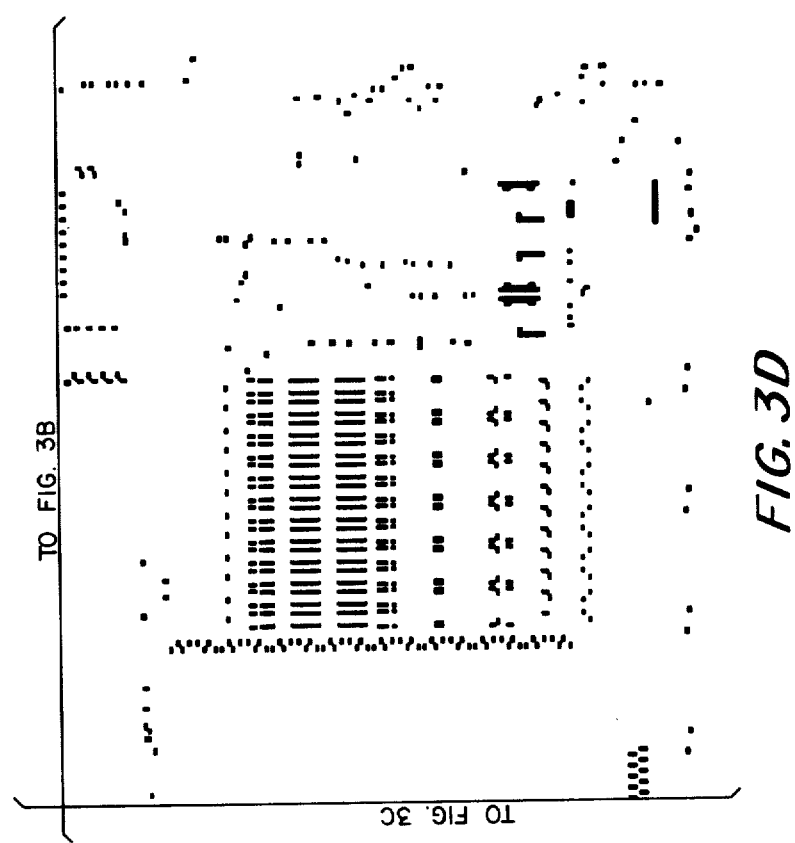

FIG. 3 is a drawing of a gate inplant mask utilized in manufacturing the depletion mode transistors. The mask is applied after the source-drain diffusion mask of FIG. 2. The darkened areas, such as 212, represent the gate implant for depletion mode transistors.

Figure 4A:
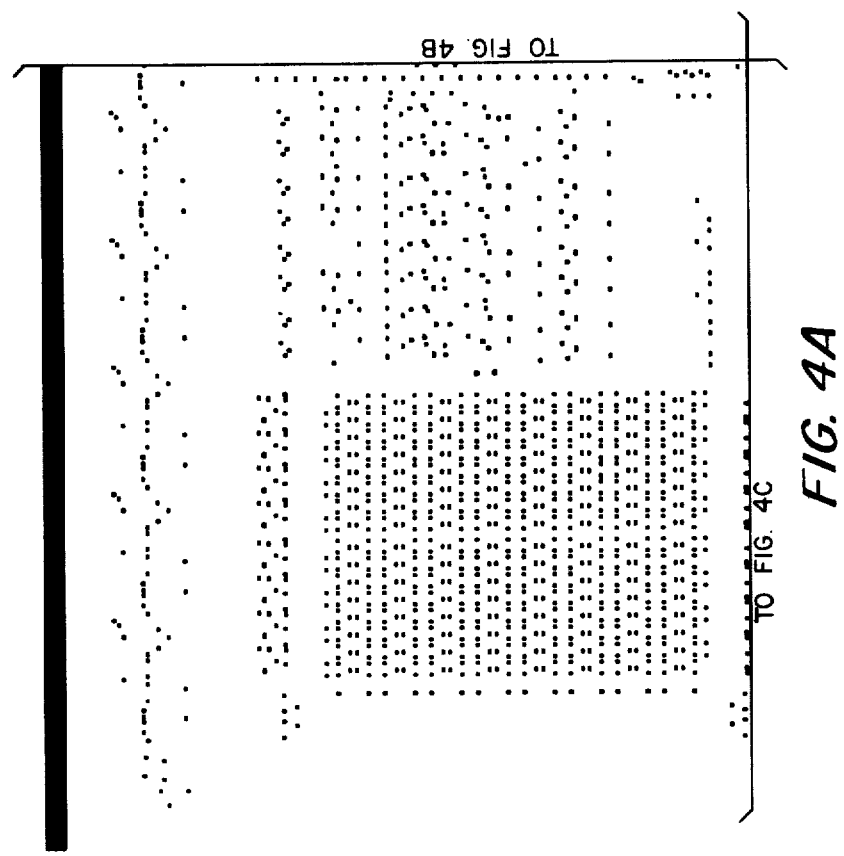
Figure 4D:
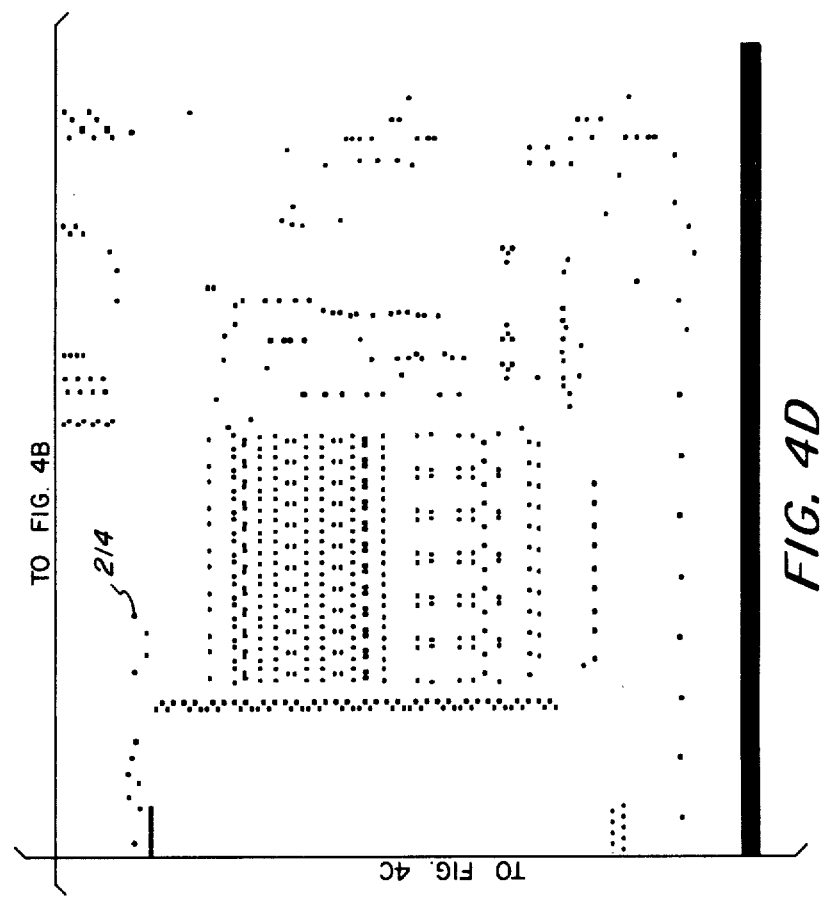
Figure 5B:
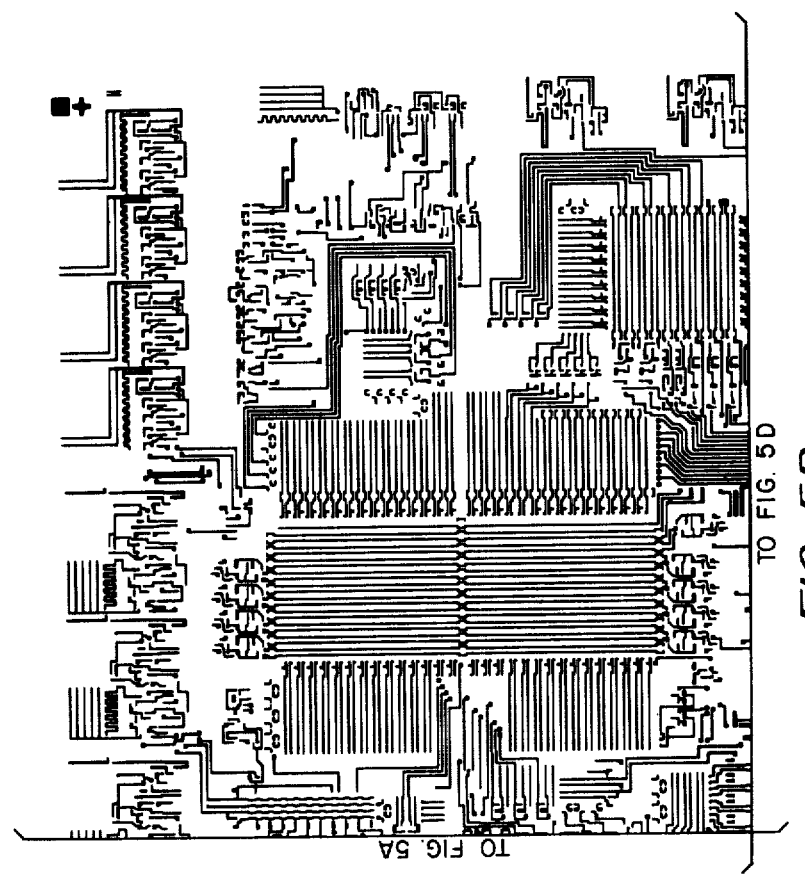
Figure 7B:
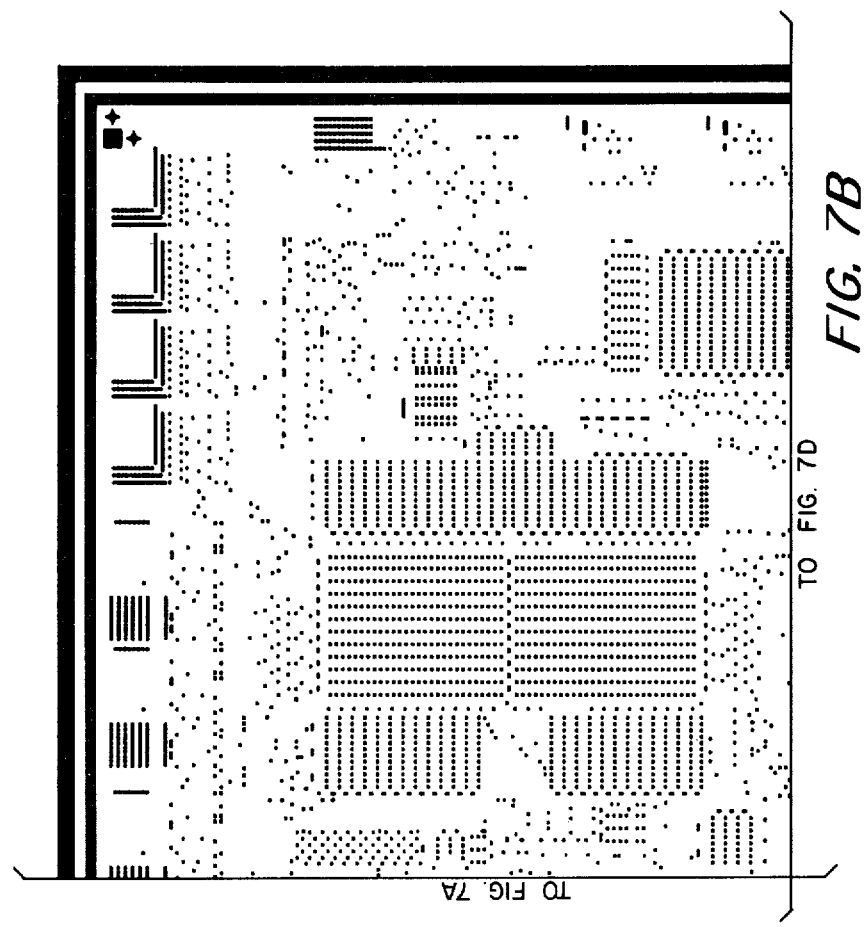
Figure 7C:
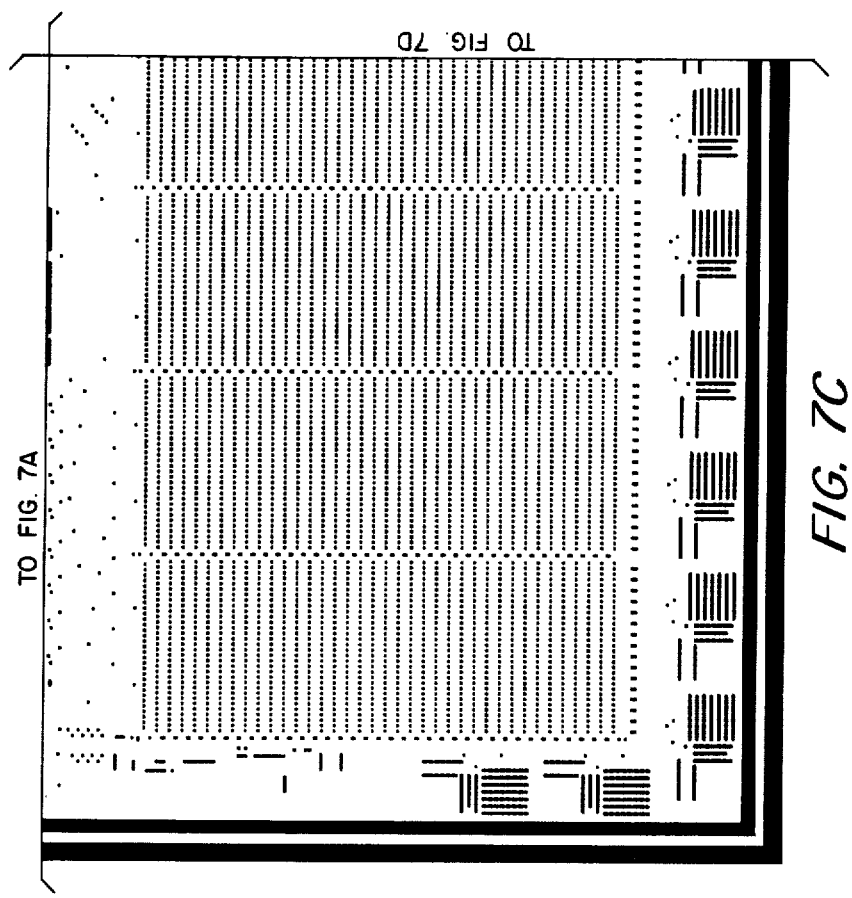
Figure 8B:
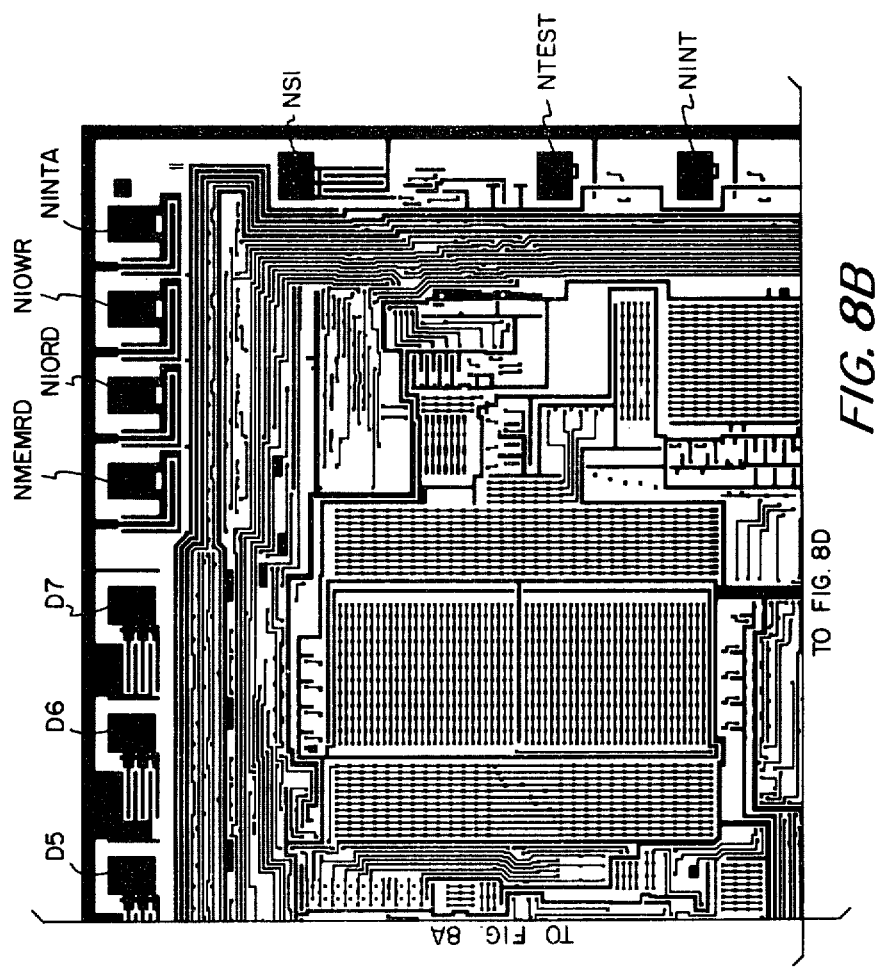

The first preohmic mask is illustrated in FIG. 4 and is applied in the manufacturing process after the gate inplant mask in FIG. 3 is applied and before the polycrystalline silicon mask shown in FIG. 5 is applied. The darkened areas such as 214 indicate where polycrystalline silicon-to-diffused region contacts are made. After the oxide initially on the semi-conductor wafer is patterned using the mask of FIG. 2, an oxide is thermally grown in the regions where silicon is exposed as a result of application of the mask. Then polycrystalline silicon is deposited on the entire wafer, and the mask in FIG. 5 is applied to pattern the polycrystalline silicon and the underlying oxide and the source-drain-channel region. The darkened regions, such as 216 and 218 in FIG. 5 represent either gate electrodes of MOS-FETs or polycrystalline silicon conductors. For example, the conductor 218 is not a gate electrode, but instead is a polycrystalline silicon line utilized as an interconnection conductor. The mask shown in FIG. 7, is applied after the source and drain regions and the polycrystaline silicon conductors are diffused. The dark spots, such as 220 in FIG. 7 indicate where the subsequent metallization pattern, defined by the mask in FIG. 8, is required to contact either polycrystalline silicon conductors or diffused silicon conductors. The metallization interconnection pattern in FIG. 8, as previously mentioned, defines the metal interconnection pattern for the microprocessor chip, accordingly to the invention. The information disclosed by FIGS. 2–8 includes the geometry and interconnections of all MOSFETs of a presently preferred embodiment of the microprocessor circuit and would enable one skilled in the art to produce the microprocessor.

Figure 6B:
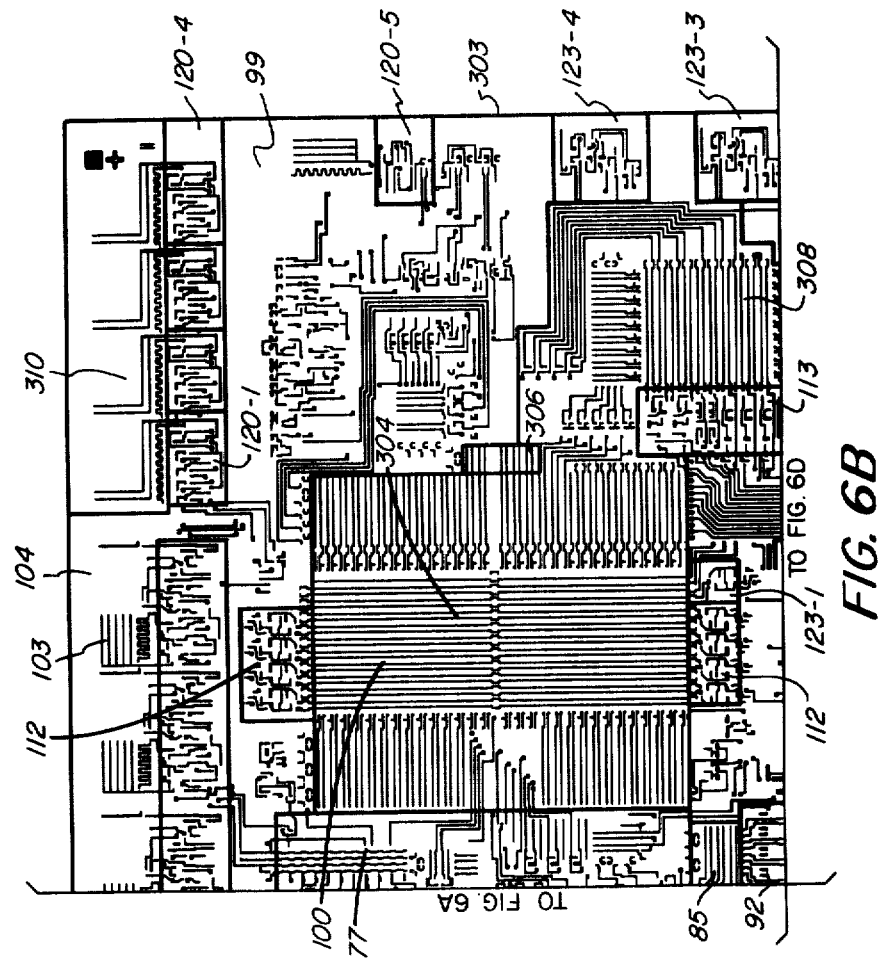

Referring now to FIGS. 1, 6 and 8 it can be seen that the microprocessor chip has four edges; a bottom edge 300, a left hand edge 301, a top edge 302, and a right hand edge 303. The edge assignments are used in explaining the topography of the chip with the realization that the chip may have an orientation other than that shown in the drawings.

The address pads 107 and address buffers 109 are located at the lower left hand corner of the chip. The first two address buffer/pad combinations being located on the left hand edge and the remaining 10 address buffer/pad combinations being located on the bottom edge. The data buffers 103 and the data pads 104 are located horizontally along the top edge starting adjacent to the ground number 1 pad which is located in the upper left hand corner.

The microprocessor is made operative by the application of two externally applied voltages Vcc and Vgg. In the preferred embodiment Vcc equals 5 volts and Vgg equals 12 volts. A Vcc voltage pad is located along the left edge above the first address pad 107. A Vgg voltage pad is located along the left edge above the Vcc pad.

The ROM 2 occupies a large portion of the chip in the lower left hand corner. The address bus 30 is located horizontally between the ROM 2 and the address buffers and pads. A column decode 24 is located horizontally between the ROM and the address bus. A row decode 22 is located vertically adjacent to the right side of the ROM. NOR gates 16 associated with the ROM are located horizontally adjacent to and above the ROM. ROM buffers 19 are located horizontally adjacent to and above the NOR gates.

The bus control 99 is located in the upper right hand corner of the chip. The data bus I/O 94 is located horizontally adjacent to and below the data buffers and pads.

The NMENRD, NIORD, NIOWR, and NINTA pads are located in the upper right hand corner along the top edge of the chip and form a pad group 310. The registers 120-1 through 120-4 associated with the pad group 310 are located horizontally between the pad group and the bus control 99.

The NSI pad is located along the right hand edge in the upper right hand corner below the registers 120. An additional register 120-5 is located along the right hand edge below the NSI pad and is associated with the NSI pad. The NTEST and register 123-4 is located below register 120-5 along the right hand side. The NINT pad and register 123-3 is located along the right hand edge below the NTEST pad and register. Ground pad number 2 is located along the right hand edge below the NINT pad and register. The NRESET pad and register 123-2 is located below the ground pad along the right hand edge. The NSTEP pad is located in the lower right hand corner. The READY pad is located along the right hand edge above the NSTEP pad. The IROMEN pad is located along the right hand edge above the READY pad. The CLKIN pad is located along the bottom edge next to the NSTEP pad. The CLKOUT pad is located along the bottom edge next to the CLKIN pad. The IROMEN, READY, CLKIN, and CLKOUT pads form a pad group 312. The clock/T-counter 125 is located in the lower right hand corner and is surrounded on two sides by the pad group 312. The stack control 48 is located above the clock/T-counter and near to the ground and NRESET pad. The stack area is located between the row decode 22 and the stack control 48. The stack area is made up of a number of register and circuit sections which are layed out on the chip from the top to the bottom of the stack area as follows; WRITE X circuitry 39, X-Register 38, stack array 32, stack read/write circuitry 44, memory address register 23, and incrementer 35. The data bus 20 is eight bits wide and is located horizontally below the data bus I/O 94, along the upper half of the left edge, and above the buffers 19, row decode 22, and stack WRITE X circuitry 39.

The RAM address register 28 is located vertically adjacent to the data bus 20. The RAM decode 5 is located vertically adjacent to the RAM address register 28. The RAM 3 is located adjacent to the RAM decode 5. The RAM input output circuitry 9 is located above and below the RAM. The ALU area 78 is located vertically adjacent to the RAM. The ALU area contains numerous registers and circuits which are layed out on the chip from the top to the bottom of the ALU area as follows; Temporary Register 59, A-Register 54, Status Register 57, ALU 52, MUX 74, and B-Register 53. The ALU control 77 is located vertically adjacent to the ALU area.

The condition decode ROM 85 is located below the ALU control 77. The CROM address register 86 is located to the left of and adjacent to the CROM 85. The Bus drivers 92 for the CROM are located below the CROM 92.

The split PLA control 100 takes up a large portion of the chip in the upper right hand corner and is surrounded by the data bus 20, the ALU control 77, the bus control 99 and the NTEST and NINT pads. The split PLA control 100 has a main PLA 304 located in the upper left hand portion of the PLA control. Input data registers 112 are located above and below the main PLA. The Z register 123-1 is located below the main PLA and to the right of the input data registers 112. Adjacent to the main PLA along the right side is located a decoder 306. Diagonal to the main PLA and in the lower right hand corner of the PLA control 100 is located the sub-PLA 308. The S-counter 113 is located adjacent to and to the left of the sub-PLA.

It should be appreciated that during the layout design, i.e., the topology design, of microprocessor chip 10, trade-offs between the topology arrangement and the location of bonding pads are weighed balanced and in some cases the sequence of bonding pads, earlier determined by application requirements, had to be renegotiated and modified.

It should be recognized that a very high level of creativity is required of the chip architect in designing MOS LSI random logic chips such as are used in microcomputers or microprocessor chips and the like because of the layout constraints for state-of-the-art manufacturing processes. For example, for silicon gate MOS manufacturing processes, the major constraints are the minimum widths and spacings of the diffused regions, minimum width and spacing for depletion mode gate implant. The minimum size required for preohmic openings in the field oxide, the spacings required from the edge of preohmic openings to the edge of diffused regions, minimum widths and spacings of polycrystalline silicon lines, the fact that such lines cannot cross over diffused regions and the minimum widths and spacings between the metal lines, and of course the constraint that conductors in the same layer, i.e., diffused regions, polycrystalline silicon lines, or metallization lines cannot cross other of same type conductors. The high amount of capacitance associated with diffused regions and the resistances of both diffused lines and polycrystalline silicon lines, or metallization lines cannot cross other of same type conductors. The high amount of capacitance associated with diffused regions and the resistance of both diffused lines and polycrystalline silicon lines and to a less extent of metal lines provide further design constraints upon the chip architect. For logic circuits which may be characterized as random logic, such as those in the subject invention, a large number of lines between sections of logic circuitry are required and the very large number of possibilities for routing the various kinds of conductors to the various required sections of the chip taxes the ingenuity of even the most competent chip topology architect, and further taxes the capacity of the most sophisticated computer interconnection conductor routing programs yet available. The computer aided design (CAD) approach has been applied to computerized random logic MOS LSI layouts for a number of years. However, it has been successful only to the extent that is provides rapid prototype designs having rather mediocre performance and requiring uneconomically large semiconductor chips. It is well established that the CAD programs currently available do not come close to matching human ingenuity in providing MOS LSI chip architectures which provide optimum performance while utilizing minimum silicon area. Clearly, there is a great deal of room for a high level of creativity in the design of MOS LSI chips. However, the economic rewards for success are substantial.

Other constraints faced by the chip architect are related to the environment in which the chip is expected to operate. For example, a chip expected to operate in a high noise environment may have substantial amounts of noise couple to the various conductors within the chip. In a chip according to the subject invention, the N-channel MOS manufacturing process utilizes relatively low MOSFET threshold voltages of the order of about one volt for an enhancement mode device and about 3 volts for a depletion mode device. The lower noise immunity of the N-Channel MOS threshold voltages means that less noise may be coupled from conductors external to the chip to critical logic circuitry within the chip.

A forty pin dual-in-line semiconductor package suitable for housing the peripheral interface adaptor chip described herein is illustrated in FIG. 9. A preferred sequence of external pin assignments is also illustrated in FIG. 8. The sequence of the pins is close to provide maximum utility in placing packaged microprocessors on a printed circuit board. It is desirable that the Vcc and Vgg voltage supply pins not be located close to each other to avoid shorts. It is also desirable that they not be symetrically located on the package so that if the package is inserted backward into the PC board with power applied damage to the semiconductor chip may be avoided. It is also desirable that the data bus input-/output pins D$\phi$-D7 be sequentially numbered and also that the address output pins A$\phi$-A15 be sequentially arranged.

While the invention has been described with reference to several embodiments thereof, those skilled in the art will recognize that the changes in form and placement of parts may be made to suit varying requirements within the scope of the invention.

What is claimed is:

1. An integrated circuit microprocessor chip that is circumscribed in a clockwise sequence by first, second, third and fourth edges thereby defining a surface therefore, said chip comprising:
   (a) an internal data bus;
   (b) an internal address bus;
   (c) I/O means located relatively along said first edge and coupled to said data bus for entering data into and for receiving data from said microprocessor;
   (d) output means located relatively along said third edge and coupled to said address bus for receiving address data from said microprocessor;
   (e) program storage means located relatively closer to said third and fourth edges than said first and second edges and including a ROM, containing instruction words coupled to said data bus and said address bus, for defining the operation of said microprocessor;
   (f) ALU means located relatively closer to said first and fourth edges than said second and third edges and coupled to said data bus for performing arithmetic and logic operations on data;
   (g) data storage means located relatively adjacent to said ALU means relatively closer to said first and fourth edges than said second and third edges and including a RAM coupled to said data bus for storing data;
   (h) mask means located relatively adjacent to said ALU means in the approximate center of said surface and coupled to said data bus for decoding a condition field of an instruction word from said program storage means; and
   (i) control means located relatively closer to said first and second edges than said third and fourth edges and coupled to said data bus, said control means receiving said instruction words from said program storage means for generating commands which define the operation of said microprocessor in response to said instruction words.

2. The microprocessor chip of claim 1 further comprising:
   (a) memory address means located relatively close to said program storage means and said third edge and coupled to said address bus for selecting a desired instruction word in said program storage means;
   (b) increment means located relatively close to said memory address means and said program storage means and coupled to said memory address means for generating the next address to be contained in said memory address means;

(c) stack means located relatively close to said increment means and said program storage means and coupled to said memory address means for storing subroutine and interrupt return addresses; and (d) addressing means located relatively between said program storage means and said fourth edge for addressing the RAM and accessing therein digits containing a plurality of bits in parallel.

3. The microprocessor chip of claim 2 further comprising timing means located relatively closer to said second and third edges than said first and fourth edges for synchronizing data signal flow.

4. The microprocessor chip of claim 3 further comprising transfer means located relatively near said stack means for transferring data from said data bus to said address bus.

5. The microprocessor chip of claim 2 wherein said program storage means further comprises:

(a) a ROM located relatively closer to said third and fourth edges than said first and second edges and columns and a plurality of rows;

(b) column decode means located relatively between said ROM and said output means and coupled to said ROM and said address bus for decoding a portion of the signal from said memory address means to select columns within said ROM;

(c) row decode means located relatively between said ROM and said stack means and coupled to said ROM and said address bus for decoding a portion of said signal from said MA means to select a row within said ROM;

(d) a plurality of NOR gates located relatively adjacent to the ROM each coupled to one of said multi-bit columns for producing said instruction word; and (e) means located relatively adjacent to said NOR gates foir driving said instruction word onto said data bus.

6. The microprocessor chip of claim 2 wherein said I/O means further comprises:

(a) a plurality of I/O ports located relatively along said first edge;

(b) data register means located relatively adjacent to said I/O ports and coupled to said I/O ports and said data bus for capturing and storing data; and (c) bus control means located relatively closer to said first and second edges than said third and fourth edges and coupled to said data register means and said control means for receiving commands from said control means, and for interpreting said commands to cause said data register means to capture and store data from said I/O ports during an input operation and for capturing and storing data from said data bus during an output operation.

7. The microprocessor chip of claim 2 wherein said ALU means comprises:

(a) logic means located relatively between said control means and said data storage means having two operand input terminals thereto and a result output terminal therefrom for performing arithmetic and logic operations on said input data;

(b) first register means located relatively between said logic means and said first edge for storing and providing to one of said operand input terminals a first operand;

(c) status register means located relatively between said logic means and said first register means for providing stored status indications received from said data bus or said result output terminal to said first register means;

(d) hold register means located relatively between said first register means and said first edge for providing temporarily stored data received from said data bus to said first register means and said data bus during an ALU operation;

(e) second register means located relatively between said logic means and said program storage means for storing a second operand received from said data bus;

(f) means located relatively between said logic means and said second register means for transferring into the other of said operand input terminals the data or the complement of the data stored in said second register means; and (g) ALU control means located relatively between logic means and said control means for interpreting commands received from said control means to cause said logic means, first register means, status register means, hold register means, second register means, transfer means and coupling means to perform desired arithmetic and logic operations.

8. The microprocessor chip of claim 2 wherein said data storage means further comprises:

(a) I/O RAM means located relatively between said RAM and said fourth edge for writing data received from said data bus into a location of said RAM and for reading data received from a location of said RAM onto said data bus, said location being determined by said addressing means:

(b) means located relatively adjacent to said RAM for said writing or said reading in response to a read-write control signal; and (c) RAM control means located relatively between said ALU means and said program control means for interpreting commands received from said control means to produce said read-write control signal.

9. The microprocessor chip of claim 2 wherein said control means comprises:

(a) a programmable logic array having a plurality of input terminals and a plurality of output terminals for carrying said commands;

(b) means for generating machine states which are selectively provided to select input terminals in response to selected commands on selected output terminals; and (c) input data register means coupled to said data bus for providing a stored instruction word received from said ROM to said programmable logic array.

* * * * *